United States Patent
McCormack et al.

[11] Patent Number: 6,054,761
[45] Date of Patent: Apr. 25, 2000

[54] MULTI-LAYER CIRCUIT SUBSTRATES AND ELECTRICAL ASSEMBLIES HAVING CONDUCTIVE COMPOSITION CONNECTORS

[75] Inventors: Mark Thomas McCormack; Hunt Hang Jiang, both of San Jose; Solomon I. Beilin, San Carlos; Albert Wong Chan, Cupertino; Yasuhito Takahashi, San Jose, all of Calif.

[73] Assignee: Fujitsu Limited, Japan

[21] Appl. No.: 09/203,126

[22] Filed: Dec. 1, 1998

[51] Int. Cl.$^7$ ...................................... H01L 23/04
[52] U.S. Cl. .................... 257/698; 257/782; 257/783; 257/780; 174/262; 174/266
[58] Field of Search .................... 257/698, 782, 257/783, 700, 701, 759, 624, 625, 780, 781; 361/792, 793, 795; 174/262, 266, 257, 255

[56] References Cited

U.S. PATENT DOCUMENTS

| | | | |
|---|---|---|---|
| 3,915,729 | 10/1975 | Eustice | 106/268 |
| 4,391,742 | 7/1983 | Steigerwald et al. | 252/512 |
| 4,619,715 | 10/1986 | Hwang | 148/23 |
| 4,789,411 | 12/1988 | Eguchi et al. | 148/24 |
| 4,859,268 | 8/1989 | Joseph et al. | 156/275.5 |
| 5,062,896 | 11/1991 | Huang et al. | 106/287.19 |
| 5,064,482 | 11/1991 | Goobich et al. | 148/24 |
| 5,088,189 | 2/1992 | Brown | 29/840 |
| 5,128,746 | 7/1992 | Pennisi et al. | 357/72 |
| 5,150,195 | 9/1992 | Nguyen . | |
| 5,156,771 | 10/1992 | Yamamoto et al. | 252/512 |
| 5,204,025 | 4/1993 | Yamada et al. | 252/500 |
| 5,328,522 | 7/1994 | Sowa et al. | 148/23 |
| 5,334,261 | 8/1994 | Minahara et al. | 148/23 |
| 5,346,558 | 9/1994 | Mathias | 148/23 |
| 5,376,403 | 12/1994 | Capote et al. | 427/96 |
| 5,382,300 | 1/1995 | Blonder et al. | 148/24 |
| 5,404,044 | 4/1995 | Booth et al. . | |
| 5,450,290 | 9/1995 | Boyko et al. . | |
| 5,640,761 | 6/1997 | DiStefano | 29/830 |
| 5,641,996 | 6/1997 | Omoya et al. . | |
| 5,714,803 | 2/1998 | Queyssac . | |
| 5,744,285 | 4/1998 | Felten et al. | 430/318 |
| 5,783,867 | 7/1998 | Bleke, Jr. et al. . | |
| 5,822,856 | 10/1998 | Bhatt et al. . | |
| 5,844,320 | 12/1998 | Ono et al. . | |
| 5,851,311 | 12/1998 | Diamant et al. | 148/23 |

OTHER PUBLICATIONS

Shell Chemical, "Shell Resins: Heloxy® 505 Modifier," 4 pages, Aug. 1993.

Shell Chemical, "Shell Resins: EPON® Resin 828," 8 pages, Oct. 1996.

(List continued on next page.)

*Primary Examiner*—Sheila V. Clark
*Attorney, Agent, or Firm*—Coudert Brothers

[57] ABSTRACT

Printed circuit substrates and electrical assemblies including a conductive composition are disclosed. The printed circuit substrate and the electrical assembly embodiments comprise a first conducting region and a second conducting region. A dielectric layer is disposed between the first and second conducting regions. An aperture is disposed in the dielectric layer and a via structure including the conductive composition is disposed in the aperture. The conductive composition is preferably in a cured state and electrically communicates with the first and second conducting regions. In preferred embodiments, the conductive composition comprises conductive particles in an amount of at least about 75 wt. % based on the weight of the composition. At least 50% by weight of the conductive particles have melting points of less than about 400° C. The composition further includes a carrier including an epoxy-functional resin in an amount of at least about 50 wt. % based on the weight of the carrier, and a fluxing agent in an amount of at least about 0.1 wt % based on the weight of the carrier. The epoxy functional resin can have a viscosity of less than about 1000 centipoise at 25° C.

38 Claims, 2 Drawing Sheets

OTHER PUBLICATIONS

Shell Chemical, "Technical Bulletin Shell Chemical Company: EPON® Resin 11120–A–80 and EPON® Resin 1123–A–80" 4 pages, Jan. 1992.

Shell Chemical, "Shell Resins: Heloxy® 62 Modifier," 4 pages, Aug. 1993.

Shell Chemical, "Shell Resins: Heloxy® 67 Modifier," 4 pages, Aug. 1993.

Ishino et al., "Development of Multilayer Wiring Board by Simultaneous Stacking Method of Tape Film" (Journal of Japan Institute of Electronics Packaging), May, 1998, vol. 1, No. 2, pp. 124–129.

MULTI-LAYER CIRCUIT SUBSTRATES AND ELECTRICAL ASSEMBLIES HAVING CONDUCTIVE COMPOSITION CONNECTORS

FIELD OF THE INVENTION

The present invention relates to conductive compositions, as well as articles and methods using conductive compositions.

BACKGROUND OF THE INVENTION

Several solder containing compositions are known and used in the electronics industry. These solder containing compositions usually comprise a powdered metal alloy, fluxing agents, binders, and solvents for the binders. The most prevalent solder containing compositions comprise lead-tin (Pb—Sn) alloys and a fluxing agent. The fluxing agent is used to remove oxides that naturally form on the surface of the alloy powder, and the binder is used to hold the fluxing agent to the solder powder and/or provide a controlled amount of slump for those compositions which are intended to be screen printed. When these solder containing compositions are heated upon reflow, the solvents boil off as a vapor, and the binders and fluxing agents decompose, generating both gaseous byproducts and non-volatile residue. These solder containing compositions are often used to electrically connect the terminals of electrical components and integrated-circuit (IC) chips to printed circuit boards.

Another material used to make such connections are metal-filled epoxy compositions. Copper or silver particles, usually less than 50 $\mu$m in size, are used with an epoxy resin and curing agent. The particles usually comprise a high weight percentage of the composition, usually greater than 75% by weight. Upon heating, the epoxy cures to immobilize the metal particles in an electrical network which makes the desired electrical connection. Epoxy resins can include branched polymers having two or more epoxide functional groups. The curing agent such as an anhydride reacts with the epoxide group to form a polymer network. The curing rate of an epoxy can be increased by increasing the number of available reactive epoxy functional groups per resin molecule. One way of characterizing the number of epoxy groups per resin molecule is to measure the number of epoxy groups per weight of resin. This can be characterized as the epoxy "equivalent weight" of the resin. Epoxy functional resins having relatively higher rates of cure usually have equivalent weights of less than 200.

Other approaches for connecting electrical components to circuit boards include the so-called "anisotropic conductive film" (ACF) and the "anisotropic conductive material" (ACM). These approaches are similar in that they both use large spherical or cylindrical conductive bodies which are distributed in a thermosetting or thermoplastic polymer. They are different in that the ACF film is preformed in the form of a bonding sheet while the ACM material is a spreadable liquid. The conductive bodies may comprise metal or metal-coated polymeric materials, which are resilient and elastic. To use the ACM or ACF, the ACM or ACF is placed between an electrical terminal and a corresponding pad and is heated with the terminal being pressed against the pad. The terminal makes electrical contact to the pad through at least one conductive body, with excess polymer being squeezed away from the top and bottom of the body by the applied pressure. Upon heating, the polymer cures and changes from a liquid to a solid. Upon cooling, the polymer shrinks in the vertical direction, and thereby applies a contractive force between the terminal and pad, which in turn maintains pressure on the conductive bodies between the terminal and pad. The term "anisotropic" arises because the conductive bodies only conduct electrical current vertically between the terminal and pad, rather than in all directions, as would be the case with a metal-filled epoxy.

The electrical connections provided by metal-filled epoxies, ACFs, and ACMs usually have higher electrical resistances than those provided by alloy solders (which, by nature, make metallurgic bonds to the terminal and pad). ACFs and ACMs are also known in the art to have long term reliability problems.

SUMMARY OF THE INVENTION

The present invention is motivated by a desire of the inventors to develop a multilayer lamination process in which several circuitized layers are laminated together to form a desired multi-layer circuit substrate structure and in which electrical connections between circuitized layers are formed simultaneously with the lamination process. Because the layers are being laminated at the same time, and because one desires to make the electrical connections between layers, the heat and pressure applied to conventional solder containing compositions can generate significant amounts of gaseous byproducts and non-volatile residue. The gaseous byproducts can leave bubbles between the layers of the formed multi-layer circuit substrate and can potentially contribute to the delamination or failure of the substrate.

Metal-filled epoxies, ACFs and ACMs can instead be used to connect circuit layers. However, these joining materials have reliability issues, particularly if the resulting board underwent long periods of high thermal cycling (i.e., large swings in temperature over long periods of time) and/or humidity exposure. Moreover, metal-filled epoxies, ACFs and ACMs can have relatively high resistivities.

Embodiments of the invention are directed to the need of finding an electrical joining material which can be used in the above multi-layer lamination process and which can provide electrical connections which have higher reliability during thermal cycling, and lower resistance than metal-fill epoxies, ACFs, and ACMs. Other embodiments of the invention can be directed to favorable and less complicated methods for forming multi-layer circuit substrates.

The present invention encompasses conductive compositions which are capable of forming metallurgical bonds to metal terminals and metal pads and do not generate significant amounts of gaseous byproducts or non-volatile residue when processed. The present invention also encompasses articles and methods using the conductive composition.

One embodiment of the invention can be directed to a conductive composition comprising conductive particles in an amount of at least about 75 wt. % based on the weight of the composition. At least 50% by weight of the conductive particles can have melting points of less than about 400° C. The composition may also include a carrier including an epoxy-functional resin in an amount of at least about 50 wt. % based on the weight of the carrier. The epoxy functional resin can have a viscosity of less than about 1000 centipoise at 25° C., preferably less than about 600 centipoise at 25° C. The carrier can also include a fluxing agent in an amount of at least about 0.1 wt % based on the weight of the carrier. The carrier may optionally include other materials.

Another embodiment of the invention can be directed to a method for forming a multi-layer circuit substrate. In particular, embodiments of the invention can be directed to the formation of a multi-layer circuit substrate having a reliable z-connection between conducting surfaces using the inventive conductive composition. A "z-connection" can be a generally vertical electrical connection between conducting layers in substrates or multi-chip modules.

These and other aspects of the present invention will become apparent to those skilled in the art from the following detailed description of the invention, the accompanying drawings, and the appended claims.

DETAILED DESCRIPTION OF THE INVENTION

Figure 1A:
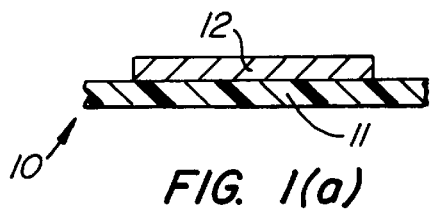
FIGS. 1(a)–1(f) show schematic cross-sectional views of an exemplary process of using a conductive composition of an embodiment of invention.

One embodiment of the invention can be directed to a conductive composition comprising conductive particles in an amount of at least about 75 wt. % based on the weight of the composition. At least about 50% by weight of the conductive particles have melting points of less than about 400° C. The composition may also include a carrier including an epoxy-functional resin in an amount of at least about 50 wt. % based on the weight of the carrier. The epoxy functional resin can have a viscosity of less than about 1000 centipoise at 25° C., preferably less than about 600 centipoise at 25° C. The carrier can also include a fluxing agent in an amount of at least about 0.1 wt % based on the weight of the carrier. In addition, the conductive composition can have a low degree of tackiness in an unthermally treated state and can have a long pot-life. For example, the conductive composition can have a pot-life greater than about one week, or preferably greater than about two weeks when stored at room temperature. When stored at 5° C. in a refrigerator, the conductive composition can have a pot-life of greater than about 6 months, preferably greater than about one year. Once heated, the conductive composition preferably increases in tackiness and can begin to solidify into a conducting structure with or without the use of additional curing agents.

Any suitable weight proportion of conductive particles can be used in the conductive composition. The conductive composition can include greater than about 75% by weight conductive particles (based on the weight of the composition). Preferably, the conductive composition includes between about 80 wt. % to about 95 wt. % conductive particles (based on the weight of the composition). The balance of the conductive composition may be the carrier.

At least 50% by weight of the conductive particles in the conductive composition can include melting points of less than about 400° C. For example, substantially all of the conductive particles in the conductive composition can have melting points of less than about 400° C. Preferably, the conductive particles in the conductive composition can include at least about 75% by weight, even more preferably greater than about 90% by weight, conductive particles having melting points less than about 400° C. In some embodiments, at least 50% by weight of the conductive particles in the conductive composition can have melting points of less than about 260° C., and even less than about 200° C. If desired, the balance of the conductive particles of the conductive composition can include conductive particles having melting points of greater than about 400° C.

The conductive particles in the conductive composition, and in particular the conductive particles having melting points of less than about 400° C., may include pure metals, metal alloys, metal alloy precursors, metallic compositions, metallic compounds, and combinations thereof. For example, the conductive particles can include one or more materials selected from the group consisting of In, Sn, Bi, Sb, Pb, Ni, Zn, Cu, Cd, Pt, Pd, Au and Ag.

Preferably, the conductive particles in the conductive composition include soft materials such as solder particles. These materials can readily deform when pressed, thus providing for good areal contact between the conductive particles, as well as to other conducting surfaces. For instance, deforming the conductive particles against conductive surface can increase the contact area with the land. Suitable examples of solder compositions can include metals, or single or multi-phase alloys. The alloys can be binary, ternary, or other higher order compositions. Examples include alloys comprised of In—Sn, Bi—Sn, In—Ag, Sn—Sb, Au—Sn, and Pb—Sn. More specific examples of solders include 52 In/48 Sn, 58 Bi/42 Sn, 97 In/3 Ag, In, 37 Pb/63 Sn, 96.5 Sn/3.5 Ag, 95 Sn/5 Sb, 80 Au/20 Sn, and 90 Pb/10 Sn (described in terms of weight percentages).

The conductive particles can have any size or geometry suitable for use in a conductive composition. The particles may have a size less than about 50 microns. Preferably, the particles have a size in the range from about 5 microns to about 30 microns. The conductive particles also can have any suitable shape. For example, the conductive particles can include one or more of the following particle shapes: spherical, irregular, plate-shaped and dendritic. Preferably, the conductive particles comprise generally spherical shapes.

The carrier can have thermosetting properties, and can constitute a major portion of the liquid portion of the composition, preferably the entire liquid portion of the composition. Also, the carrier can include any suitable combination of components including a resin, fluxing agents, and curing agents. Preferably, the carrier is substantially non-volatile, so that the conductive composition does not exhibit substantial weight loss when heated. For example, the uncured inventive composition may have a weight loss of less than about 3 percent on a 10° C. per minute ramp from ambient temperatures to 250° C.

When making z-connections between conducting surfaces in a multi-layer circuit substrate, the conductive composition can be disposed in an aperture formed in a dielectric layer derived from an adhesive bonding sheet. Typically, the composition is sandwiched between two conducting surfaces covering the aperture on opposite sides of the dielectric layer. The conductive composition can then be heated, and optionally pressed, to melt the conductive particles and then cure the resin. During this time, the carrier preferably produces little or no gas, even when the carrier is heated to or above the melting temperature of the conductive particles in the conductive composition. The substantial absence of volatile components in the carrier reduces the likelihood that bubbles will be produced and consequently reside in the formed via structure or between the layers of the multi-layer circuit substrate. The presence of bubbles may increase the resistivity of the formed via structure, because bubbles can inhibit the wetting and the bonding of the conductive particles during heating. The formation of bubbles during the formation of a multi-layer circuit substrate may also increase the likelihood that the formed multi-layer circuit substrate will delaminate or induce other reliability failures.

For example, bubbles formed by the volatilization of the carrier in response to heating can coalesce and migrate away from the formed via structure into a region between the dielectric layer and an adjacent circuitized layer. The coalesced bubbles can be characterized as "blisters", and can cause the dielectric layer and an adjacent circuitized layer to delaminate or separate from each other.

Furthermore, in preferred embodiments of the invention, the carrier can be non-tacky when the carrier has not undergone thermal treatment, but becomes tacky when thermally treated (e.g., when thermal curing commences). As explained previously, the conductive composition can be disposed in apertures of a dielectric layer derived from an adhesive bonding sheet. The conductive composition can be deposited into the apertures by stenciling the conductive composition through a stencil having apertures aligned with the apertures in the dielectric layer. In preferred embodiments, the stencil can be an apertured flexible release layer. After the conductive composition is deposited through the apertures of the release layer, the release sheet can be removed leaving the conductive composition disposed in the vias of the dielectric layer. Because the carrier in the conductive composition remains non-tacky during this deposition procedure (i.e., before the composition is cured), the conductive composition does not adhere to the release layer when it is deposited into the apertures of the dielectric layer. Consequently, the amount of conductive composition deposited into the apertures of the dielectric layer can be maximized.

Preferably, the carrier curing time can be relatively long. For example, the liquid carrier can form a stable gel after a time greater than about 60, 120, 180, and even 300 seconds, after the conductive composition is heated to the melting temperature of the conductive particles in the conductive composition. The carrier gelling time can also be increased by increasing the equivalent weight of the resin. By increasing the gelling time of the carrier, the conductive particles in the conductive composition can melt and flow into a cohesive body before the gelled carrier inhibits contact between the melting conductive particles. After the conductive particles fuse and form a cohesive body, the carrier can gel and then further solidify and chemically react the carrier in response to increased heating and/or the action of a curing agent or hardener to cure the conductive compostion.

Suitable resins can include molecules (e.g, compounds, polymers, oligomers) with epoxy functionality. In such resins, the weight of the resin per epoxide can be greater than about 300, 400, or 500. Preferably, the epoxy functional resin includes a weight per epoxide greater than about 500. More preferably, the epoxy functional resin preferably has a weight per epoxide between about 550 to about 660. Also, the resin can include an epoxy-functional molecule having a molecular weight (e.g., a weight average molecular weight) greater than about 1000, preferably between about 2000 and about 3000. The epoxy-functional resin can include epoxy functional molecules alone or in combination with other nonepoxy functional molecules.

The resin can be derived from a natural substance such as a natural resin or a natural oil. Fatty acids and derivatives (e.g., a glyceride) thereof, especially epoxy-functional derivatives of fatty acids (e.g., a glyceride of ricinoleic acid), can be included in the resin. Many fatty acids have high molecular weights, but have a low degree of functionality. Preferred epoxy-functional resins can be derived from oils such as castor oil. Specific examples of such epoxy functional resins can include some Heloxy® series resins commercially available from Shell Corporation including Heloxy® 505.

The resin preferably has a low viscosity. For example, the resin can have a viscosity of less than about 1000 centipoise at 25° C., preferably less than about 600 centipoise at 25° C. The viscosity of the resin is more preferably between about 300 to about 500 centipoise at 25° C. The resin and carrier as a whole can have a viscosity of less than about 50 centipoise (preferably less than about 10 centipoise) for a time greater than about 1 minute when heated at or above the predominant melting temperature (e.g., between 200–290° C.) of the conductive particles in the composition. The "predominant melting temperature" of the conductive particles in the composition can be the melting temperature at which a majority of the conductive particles in the conductive composition melt.

Advantageously, the low viscosity resin can be rapidly displaced from interparticle positions within the conductive composition when it is processed (e.g., heated, compressed) in an aperture with non-wettable walls. The displacement of the resin can permit greater contact and wetting between the conductive particles in the conductive composition. Also, because the viscosity of the resin is relatively low, it is not necessary to add additional solvent to the composition or carrier to make the composition less viscous. Accordingly, the resin and/or the carrier are preferably free of a solvent.

The fluxing agent can include any material suitable for removing oxides from conducting surfaces such as pads and particles. However, the fluxing agent preferably comprises an organic acid. Organic acids are preferred because they can have relatively high boiling points. Exemplary fluxing agents can include cinnamic acid, succinic acid, gluteric acid, adipic acid, pimelic acid, suberic acid, azelaic acid, adipic acid, sebacic acid, precursors and combinations thereof. Preferably, the fluxing agent comprises at least one of cinnamic acid, adipic acid or another acid which functions in a chemically similar manner or has a chemically similar structure. Moreover, the fluxing agent can be in the carrier in any suitable percentage, but can preferably constitute from about 0.1 to about 25 weight percent of the carrier.

The time required to solidify the carrier can be increased if the fluxing agent has low functionality. For example, the fluxing agent can have two or less carboxyl groups and/or can be free of hydroxyl groups. As explained previously, increasing the carrier gelling time is favorable, because it permits the conductive particles to melt and bond together before the carrier hardens.

Like the resin, the fluxing agent can be substantially non-volatile (e.g., does not boil or volatize in a substantial manner when the conductive composition is cured). In some embodiments, the fluxing agent can have a melting point of about 100° C. or more, and/or a boiling or decomposition point of about 260° C. or more. The boiling or decomposition point of the fluxing agent, whichever is lower, can be greater than the lowest melting point (e.g., greater than about 10° C.) present among the conductive particles. Accordingly, the selection of the particular fluxing agent may depend on the particular conductive material used in the composition. For example, the fluxing agent may be cinnamic acid which has a melting point of about 133° C. and boiling point of about 300° C. Suitable conductive particles which can be used with cinnamic acid include particles made of 37 Pb/63 Sn solder, which has a melting temperature of about 183° C.

In some embodiments, the fluxing agent is optionally capable of curing the resin after the fluxing and the melting of the conductive particles in the composition has commenced. In other words, the fluxing agent can remove oxides from the conductive particles in the composition and then contribute to the curing of the carrier resin, particularly at higher process temperatures (e.g., greater than about 200° C., preferably greater than about 250° C.). Since the fluxing agent in these embodiments can chemically link molecules in the resin, the fluxing agent can be incorporated into the cured resin by providing chemical linkages to the molecules in the resin. This can significantly reduce the amount of flux which is free to participate in undesirable chemical reactions, such as corrosion which may occur after the connection is made or is in service. Furthermore, the presence of unused flux in an unbound form can produce undesired surface conduction, which could induce short circuiting between separated conducting regions in a multi-layer circuit substrate. Moreover, a process using such fluxing agents can be less complicated, because fewer starting materials are needed. For example, in some embodiments, the use of a separate curing agent or hardener is not needed, thus reducing the number of components used in the conductive composition. In these embodiments, the composition can include a greater proportion of fluxing agent than is used conventionally. Since the fluxing agent may act as a curing agent, the amount of fluxing agent can be increased, thus dispensing with the need to use additional curing agents to cure the resin. For instance, in some embodiments, additional curing agents need not be used if the fluxing agent is greater than about 15 or greater than about 20 weight percent of the carrier.

However, if desired, the carrier can also include additional curing agents or hardeners to aid the curing of the resin. Curing agents or hardeners can be added to the full equivalent weight (i.e., the amount of hardener to fully cure the resin) of the epoxy functional resin. For example, the amount of hardener added can be such that substantially all of the hardener will react with substantially all of the epoxy groups in the epoxy functional resin. If used, the hardener or curing agent can be added to the carrier in an amount less than about 30 wt. % of the carrier. Suitable curing agents or hardeners can include anhydrides such as methyltetrahydrophthalic anhydride (MTHPA), nadic methyl anhydride (NMA), and dodecyl succinic anhydride (DDSA). MTHPA is preferred, because MTHPA can advantageously increase the carrier curing time, thus permitting the conductive particles to melt and coalesce into a network more effectively and reliably. It is also preferred that the optional hardener have no hydroxyl groups, because hardeners without hydroxyl groups can advantageously increase the carrier gelling time.

Additional materials may be added to the carrier or conductive composition. For example, inhibitors and surfactants can be added to the carrier.

Once the carrier and the conductive particles are selected, the carrier and the conductive particles can be mixed together by any suitable operation and with any suitable apparatus to impart uniformity to the conductive composition. For example, the conductive particles and the carrier can be mixed together by mechanically mixing the conductive composition in an apparatus such as a stirrer or blender. The mixing of the components of the conductive composition can be performed while the components are heated.

The conductive composition can be heated to or above the melting temperature of the conductive particles in the composition to cure the composition. Any suitable heating apparatus can be used including an infrared furnace. A preferred heating apparatus can be a heated hydraulic press. As heat is applied to the conductive composition, the conductive particles begin to coalesce into a conductive network. If the conductive composition is applied to a conductive surface such as conductive pad, the melting conductive particles can also begin to bond (e.g., form an intermetallic, alloy, or diffusion bond) to the conductive surface. After the conductive particles begin to coalesce and bond to each other and to other conducting surfaces, the carrier can begin to gel and then harden in response to the continued application of heat and/or the application of more heat.

The conductive composition can be used in any particular manner, but is preferably used to create via structures or vertical z-connections between conducting layers in a flexible or rigid multi-layer circuit substrate. Via structures can be formed by depositing the conductive composition in an aperture in a dielectric layer. This can be done before, during, or after a conducting region is disposed over or under the aperture. The walls of the apertures can be bare before the conductive composition is deposited, or the walls can be coated with a conductive metal (e.g. electroplating the walls of the via). The conductive composition can be deposited into the apertures by any suitable method including doctor blading, screen printing, stenciling, or through the use of one or more syringes.

Preferably, the conductive composition is deposited into the apertures of a dielectric layer with a stencil. The stencil can be made of any suitable material including a metal such as stainless steel, nickel, molybdenum or other refractory metals or alloys. Alternatively, the stencil can be made of a polymer such as polyimide, polyester, or polyamide. The stencil can also be rigid or flexible. In exemplary uses, the dielectric layer of the subsequently formed multi-layer circuit substrate is derived from a bonding sheet and the stencil is a flexible release layer on the bonding sheet. (An exemplary bonding sheet is a Nippon Steel SPB-A polyimide bonding sheet which has a polyester release layer on one surface and an aluminum release layer on the other). The release layer and the bonding sheet layer can have corresponding apertures for receiving the conductive composition. Any suitable method including mechanical drilling, punching, chemical etching, photolithography, laser drilling, etc., can be used to form the apertures in the bonding sheet and the release layer. A suitable process for forming apertures in the release layer and the bonding sheet is described in U.S. patent application Ser. No. 09/192,003 entitled Multilayer Laminated Substrate for High Density Packaging to Jiang et al. filed on Nov. 13, 1998, which is assigned to the same assignee as the present invention, and is herein incorporated by reference in its entirety. The apertured bonding sheet and release layer can be disposed over a circuitized structure so that the apertures correspond to conducting regions on the circuitized structure. A conductive composition can then be disposed in the apertures of the bonding sheet so that the conductive composition contacts the conducting regions under the apertures.

A preferred method of using the conductive composition and the bonding sheet can be described with reference to FIGS. 1(a)–1(f). The method illustrated in these Figures as well as the corresponding description are for illustration purposes and are not intended to be limiting. For example, although the following discussion refers to conductive pads, the conductive pads may alternatively be conducting regions such as lines, posts, or conductive leads or joints attached to a chip. The conducting pads may alternatively be conducting regions such as metal-coated apertures in a dielectric layer. In another example, although the formed multi-layer circuit substrate has two dielectric layers and two pads, it is understood that the conductive composition according to embodiments of the invention can be used to form a multilayer circuit substrate having any suitable number of layers. For example, the final multi-layer circuit substrate can have three, four, five, etc. conducting or dielectric layers.

The multi-layer circuit substrate can be incorporated into any suitable electrical assembly. Exemplary assemblies include a chip modules such as multi-chip modules or single chip modules, as well as grid array packages such as ball grid arrays or pin grid arrays. In such electrical assemblies one or more chips can be disposed on the multi-layer circuit substrate and can be in electrical communication with a via structure in the multi-layer circuit substrate. The electrical assemblies can also include one or more multi-layer ceramic circuit substrates or rigid polymeric wiring boards in any suitable combination or permutation with a flexible, rigid polymeric, or ceramic multi-layer circuit substrate made with the inventive composition. For example, the inventive composition can provide a z-connection between a flexible multi-layer circuit substrate, and a ceramic or rigid polymeric circuit structure. Other devices such as heat sinks may optionally be included in the electrical assemblies.

FIG. 1(a) shows a first circuitized structure 10 including a dielectric layer 11 and a conductive pad 12. The dielectric layer 11 can include any suitable material including a ceramic or polymeric material. The conductive pad 12 can also be made of any suitable material including metals and metal alloys with which the inventive composition can form a metallurgical bond. Preferably, the conductive pad can include copper. The pad can also be coated with one or more layers of any suitable metallic material including brass, bronze, Zn, Ni, Sn, Cd, Bi, Au, In, Pd, Ag, solder, alloys, and combinations thereof. Any suitable method can be used to coat the conductive pad 12. For example, electroless, electrolytic, and immersion plating can be used to deposit a metallic material on the conductive pad 12. Other suitable methods can include sputtering, evaporation, hot air solder leveling, dip coating, meniscus coating, wave soldering, and other lamination or coating methods known in the art.

Figure 1B:
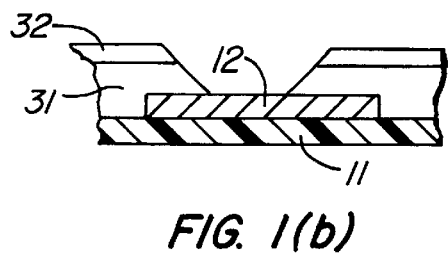

As shown in FIG. 1(b), a bonding sheet 31 and a release layer 32 can have an aperture or a plurality of apertures extending through the bonding sheet 31 and the release layer 32. The bonding sheet 31 is tack laminated to the first circuitized structure 10 so that the aperture is disposed over the conductive pad 12. Alternatively, an unapertured bonding sheet/release layer combination can be tack laminated to a circuitized structure. The combination can then be laser drilled to form apertures in the bonding sheet and the release layer. The bonding sheet 31 can include a thermoplastic or thermosetting adhesive and can have a thickness greater than about, e.g., 10 microns.

Figure 1C:
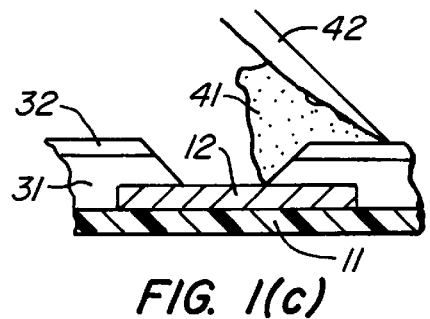
Figure 1D:
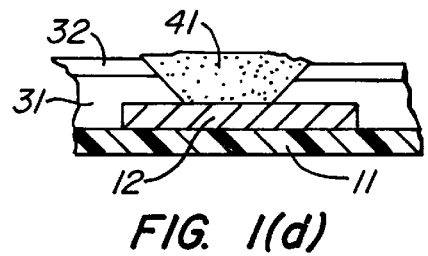

After the bonding sheet 31 and the release layer 32 are disposed over the first circuitized structure 10, a conductive composition 41 is deposited into the aperture. As shown in FIG. 1(c), the conductive composition 41 is deposited with a squeegee 42. The squeegee 42 guides the conductive composition 41 into the aperture in the bonding sheet 31. The apertured release layer 32 acts as a stencil which dispenses a suitable amount of conductive composition on the conductive pad 12. As shown in FIG. 1(d), the conductive composition 41 can be substantially level with the upper surface of the release layer 32 after the squeegee 42 passes over the aperture. If desired, the structure shown in FIG. 1(d) can be soft-baked at low temperatures in a heating apparatus (e.g., between about 80° C. to about 120° C.) for about 10 to about 30 minutes to remove any air bubbles or residual volatiles and possibly harden a very thin surface layer which may aid in subsequent alignment and assembly with other layers of a resulting multi-layer circuit structure.

Figure 1E:
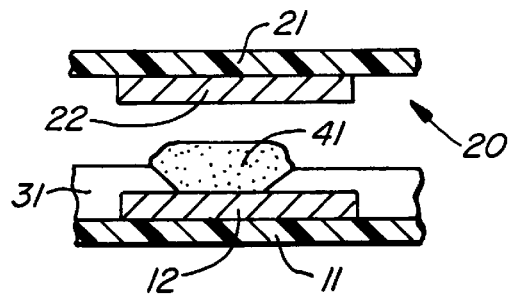

After the conductive composition 41 fills the aperture of the bonding sheet 31, the release layer 32 is separated to expose the upper surface of the bonding sheet 31. Once the release layer 32 is removed, the conductive composition 41 preferably extends above the upper surface of the bonding sheet 31. Subsequently, and as shown in FIG. 1(e), a second circuitized structure 20 having a dielectric layer 21 and a conductive pad 22 is disposed over the first circuitized structure 10 so that the conductive pad 22 on the second circuitized structure 20 faces the conductive pad 12 on the first circuitized structure 10. Once aligned, the conductive composition 41 is sandwiched between the conductive pads 12, 22.

The conductive composition 41 can then be heated and compressed, preferably under vacuum. The conductive composition can be compressed by, e.g., applying pressure to either or both of the outer surfaces of the first and second circuitized structures 10, 20 with, e.g., heated platens (not shown) so that the conductive composition 41 is compressed between the pads 12, 22. By compressing the conductive composition 41, the conductive particles in the composition can deform against each other and against the pads 12, 22. The compression can densify the conductive portion of the composition, thus providing for good areal contact between the plurality of conductive particles and the pads. For example, the conductive particles in the conductive composition 41 can make contact with greater than about 40, 60, and even 80 percent of the area of the conductive pads 12, 22 exposed through the dielectric layer 31 after this compression step.

Figure 1F:
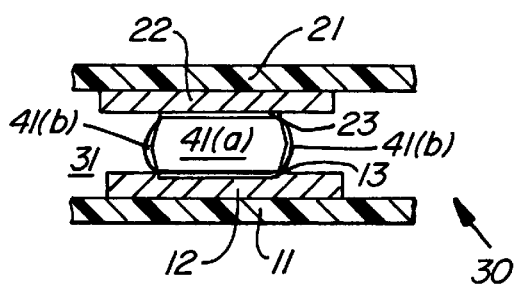

Heating the conductive composition in the via structure, alone or in combination with pressure, displaces the carrier components away from the conductive particles, especially when the aperture walls are non-wettable. For example, as shown in FIG. 1(f), when forming a via structure, heat and pressure can be applied to the conductive composition 41 in the aperture with heated platens (not shown) in contact with the outer surfaces of the circuitized structures 10, 20. The applied heat can cause the conductive particles to melt and coalesce together. Prior to or during this melting, the fluxing agent in the carrier removes oxides from the conductive particles, thus enhancing their ability to bond and electrically connect to the pads and to the other conductive particles. The coalescing of the conductive particles displaces the less dense liquid carrier in an outward direction. While this is occurring, the pressure applied by the platens can compress the conductive particles into a mass of conductive particles and can further force some of the carrier in an outward direction. As a result, the displaced carrier can be somewhat separated from the resulting mass of coalescing conductive particles. The displaced carrier can form a generally concave cylindrically-shaped body of liquid 41(b) surrounding the compressed, columnar mass of conductive particles 41(a). When the body of liquid carrier 41(b) eventually hardens, the resulting hardened annular structure is disposed around the mass of fused conductive particles thus forming a via structure in a cured state. The cured annular structure can have less than about 10 wt. %, preferably less than about 5 wt. %, metallic material, with the balance being the cured components of the carrier.

As shown in FIG. 1(f), the mass of conductive particles 41(a) can bond to the conductive pads 12, 22 via the bonding regions 13, 23. The bonding regions 13, 23 can include intermetallic layers created by the diffusion and chemical reaction of atoms between the conductive pads 12, 22 and the mass of conductive particles 41(a). For example, the pads may include copper (Cu) while the conductive particles can include Pb/Sn solder. The resulting bonding region can comprise an intermetallic layer with at least Cu and Sn atoms. These bonding regions 13, 23 provide good electrical and mechanical joining between the conductive pads 12, 22 and the melt coalesced conductive particles in the conductive composition. In some embodiments, the areal coverage of the bonding regions 13, 23 can constitute greater than about 75%, and preferably greater than about 95% of the area of a corresponding pad 12, 22 exposed through the dielectric layer 31 on the corresponding pad 12, 22.

In addition, during or after the processing of the conductive composition 41, the bonding sheet 31 may also be cured if the bonding sheet is thermosetting. Curing the bonding sheet 31 may be desirable if the desired product is a rigid multilayer circuit substrate. The resulting structure is a multi-layer circuit substrate 30 having a structurally stable yet highly conductive z-connection or via structure.

As the conductive composition is heated, the substantially non-volatile carrier can gel and harden while producing little or no gas. The absence of, or the substantial absence of gas during the production of the via structure substantially reduces the probability of bubbles forming within the via structure. As explained previously, the absence of bubbles in the via structure reduces the likelihood that the formed multi-layer circuit substrate will delaminate, and further provides greater conductivity to the via structure.

Figure 2A:
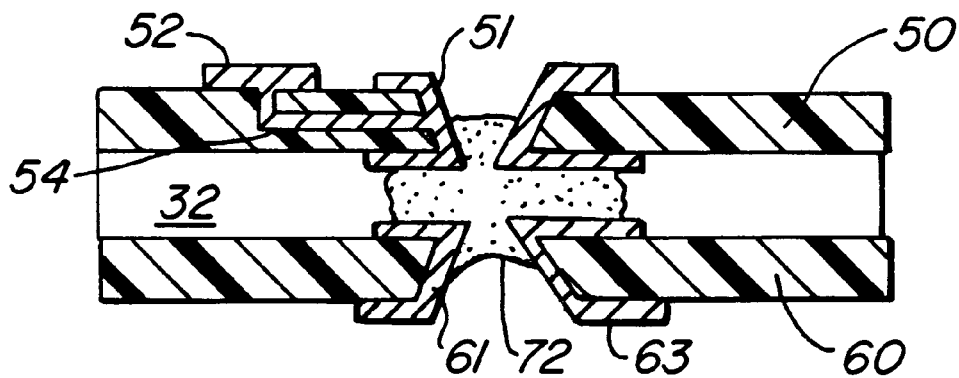
FIGS. 2(a)–2(b) show cross-sectional views of embodiments of the invention.
Figure 2B:
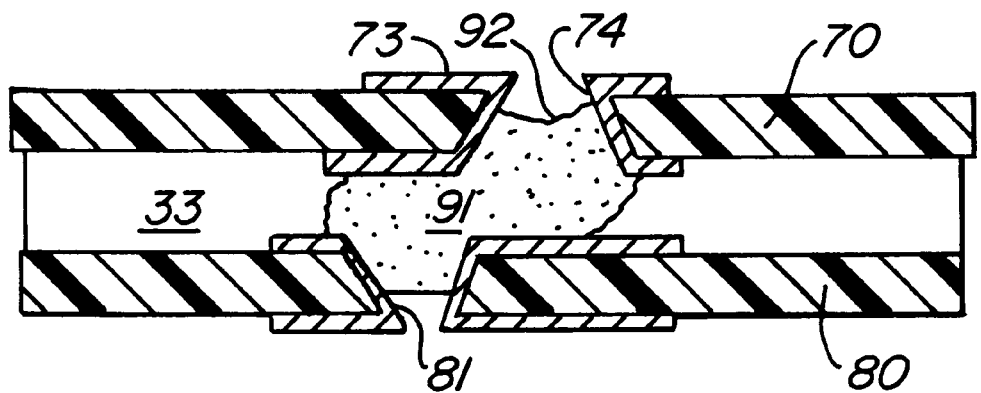

Other embodiments of the invention can be described with reference to FIGS. 2(*a*) and 2(*b*). FIGS. 2(*a*) and 2(*b*) each show multi-layer circuit substrate embodiments.

FIG. 2(*a*) shows a multi-layer circuit substrate having a dielectric layer 32 disposed between a first circuitized structure 50 and a second circuitized structure 60. The first circuitized structure 50 can include an internal conducting line 54 and an external pad 52. As shown in FIG. 2(*a*), each of the first and second circuitized structures 50, 60 includes an aperture, and the apertures have an annular conductive coating 51, 61 on the aperture walls. The apertures in the first and second circuitized structures 50, 60 are tapered so that the apertures are narrower at the inward surfaces than at the outward surfaces of the first and second circuitized structures 50, 60. Of course, the relative orientation of either or both aperture tapers may be selected (e.g., reversed) according to manufacturing preferences. An external pad 63 can be electrically connected to the conductive coating 61 on the aperture wall of the second circuitized structure 60. Either or both of the pads 52, 63, can be in electrical communication with an electrical device such as a chip or another multi-layer circuit substrate (not shown).

A via structure 71 comprising the inventive conductive composition in a cured state is disposed in an aperture in the dielectric layer 32 and is disposed between the apertures in the first circuitized structure 50 and the second circuitized structure 60. The via structure 71 is in electrical contact with the conductive coatings 51, 61 on the walls of the apertures of the first and second circuitized structures 50, 60 and electrically communicates the first and second circuitized structures 50, 60. Also, the via structure 71 may include a concave portion 72 and may extend into an overlying or underlying coated aperture so that the via structure partially fills the overlying or underlying coated aperture. The concave portion may be formed as a result of capillary action of the conductive coating 61 on the conductive composition (i.e., before gelling or hardening) present within the aperture of the second circuitized structure 60 during processing. The portion of the via structure partially filling the overlying or underlying coated apertures may alternatively be relatively flat or convex.

Unlike the embodiment shown in FIG. 1(*f*), in FIG. 2(*a*), the conducting regions in electrical communication with the via structure are generally annular conductive structures (e.g., annular coatings) 51, 61, and are not generally planar conductive pads. Moreover, unlike the embodiment shown in FIG. 1(*f*), the resulting via structure has an irregular shape and can conform to the shape of the underlying and overlying apertures.

Another embodiment of the invention is shown in FIG. 2(*b*). FIG. 2(*b*) shows a multi-layer circuit substrate having a dielectric layer 33 disposed between a first circuitized structure 70 and a second circuitized structure 80. As shown in FIG. 2(*b*), each of the first and second circuitized structures 70, 80 includes an aperture, and the apertures have a conductive coating 74, 81 on the aperture walls. The apertures in the first and second circuitized structures 70, 80 are tapered so that the apertures are narrower at the external surfaces than at the internal surfaces of the first and second circuitized structures 70, 80. The relative orientation of either or both aperture tapers may be selected (e.g., reversed) according to manufacturing preferences. An external pad 73 can be electrically connected to the conductive coating 74 on the walls of the first circuitized structure 60. The external pad 73 can be in electrical communication with an electrical device such as a chip or another multi-layer circuit substrate (not shown).

A via structure 91 comprising the inventive conductive composition in a cured state is disposed in an aperture in the dielectric layer 33 and is disposed between the apertures in the first circuitized structure 70 and the second circuitized structure 80. The via structure 91 is in electrical contact with the conductive coatings 74, 81 on the walls of the apertures of the first and second circuitized structures 70, 80, and electrically communicates the first and second circuitized structures 70, 80. Like the embodiment shown in FIG. 2(*a*), the via structure 91 may include a concave portion 92 which partially fills an overlying aperture in the first circuitized structure 70. The portion of the via structure partially filling the overlying or underlying coated apertures may alternatively be relatively flat or convex.

Unlike the embodiments shown in FIG. 1(*f*) and FIG. 2(*a*), the embodiment shown in FIG. 2(*b*) includes conducting regions (i.e., annular conductive structures), which are in a offsetting relationship. Moreover, the via structure 91 can have a somewhat diagonal or horizantal disposition to electrically communicate the offset conducting regions in a generally vertical direction. Accordingly, the inventive composition can advantageously provide for a variety of different types of z-connections in a multi-layer circuit substrate.

The via structures according to embodiments of the invention can have favorable physical and electrical properties. Further, the via structures provide uniform conductivity, and are highly reliable. For example, the via structures (or other conductive structures) made according to embodiments of the invention can have resistances of less than about 50, 25, 15, and even 10 milli-ohms when the via structures have an average height between about 10 to about 100 microns, and an average diameter between about 40 to about 500 microns. More specifically, for a via structure having a diameter of about 180 microns and a height of about 50 microns, the via structure can have a resistance can be less than about 5, 3, or even 2 milli-ohms. For a via structure having a diameter of about 70 microns and a height of about 25 microns, the via structure can have a resistance of less than about 8, 5, and even less than 3 milli-ohms. For a via structure having a diameter of about 40 microns, and a height of about 25 microns, the via structure can have a resistance less than about 10, 7, and even less than about 5 milli-ohms. The resulting multi-layer circuit substrate performs favorably even when subjected to humid conditions and high thermal cycling. In addition, the regions of the multi-layer circuit substrates proximate the via structures are free of, or substantially free of blistering. Moreover, in embodiments of the invention, peel strengths of greater than about 1.0 kg/cm can be obtained.

The following Examples are intended to be illustrative and not limiting.

EXAMPLE 1

A conductive composition according to an embodiment of invention was made. A carrier was formed. Based on 100 parts of the carrier, 73 parts by weight of Heloxy® 505 resin and 5 parts by weight of solid cinnamic acid were mixed together in a container. The contents of the container was heated up to a temperature between 140–160° C. to dissolve the cinnamic acid in the resin. As this mixture was cooling, 22 parts by weight of MHTPA (based on 100 parts of the carrier) was added to the mixture to form the carrier. Solder particles having 37 weight percent lead and 63 weight percent tin, and sizes less than about 20 microns (i.e., type 6 Pb—Sn solder) were mixed with the carrier to form the conductive composition. The amount of solder particles mixed with the carrier was such that the final conductive composition included about 90 weight percent solder particles and about 10 weight percent carrier.

EXAMPLE 2

A multi-layer circuit substrate was formed with the conductive composition of Example 1. In particular, the conductive composition of Example 1 was used to electrically communicate two flexible circuit substrates via conductive copper pads on the two flexible circuit substrates. A 25 micron thick release layer and a 50 micron thick bonding sheet made of a thermosetting epoxy-based adhesive was adhered to a side of a flexible circuit substrate having plural conductive pads by using 100 psi of pressure at 80° C. under vacuum. Next, a plurality of apertures were formed in the bonding sheet and release layer with a laser, so that the bonding sheet and release layer included apertures having diameters of about 70 microns and about 180 microns. These apertures were disposed over conductive pads on the flexible circuit substrate. The apertures were filled with the conductive composition of Example 1 so that the composition contacted the conductive pads on the flexible circuit substrate. To fill the apertures with conductive composition, a squeegee was used to deposit the conductive composition into the apertures. The resulting structure was then softbaked at a temperature between 80–100° C. for 15 minutes (no volatization of the conductive composition components was observed).

Next, the release layer was peeled off of the bonding sheet thus exposing the bonding sheet. Then, a second flexible circuit substrate was adhered to the exposed bonding sheet so that the conductive pads on the second flexible circuit substrate were aligned with the conductive composition disposed in the apertures of the bonding sheet. The resulting combination was pressed in a vacuum lamination hydraulic press and was heated to a temperature between about 200° C. to about 210° C. for about 3 minutes with platens preheated to 225° C. in contact with the flexible circuit substrates. Under this constant pressure, the combination was cooled to 175° C., and the bonding sheet was cured for 60 minutes prior to cooling to room temperature. The solder in the apertures melted and coalesced into substantially 50 micron-high, generally cylindrically-shaped solder via structures having diameters of about 70 and about 180 microns. Ends of the via structures were bonded to respective confronting conductive pads on the two respective flexible circuit substrates providing electrical communication between confronting pads. The electrical resistance of the formed solder via structures between the pads was observed to be about 3.5 milli-ohm (with a standard deviation of 0.1 milli-ohm) for the 70 micron via structures and was about 2.0 milli-ohm (with a standard deviation of about 0.1 milli-ohm) for the 180 micron via structures. Over 17,000 via structures were formed, and a favorable peel strength of about 1.2 kg/cm was obtained. The peel strength was measured in a region proximate to, but away from the formed via structure. No blistering was observed.

EXAMPLE 3

A conductive composition according to another embodiment of invention was made. In this embodiment, the conductive composition was lead-free. As in Example 1, a carrier was formed in this example. Based on 100 parts of the carrier, 77 parts by weight of Heloxy® 505 resin and 11 parts by weight of solid cinnamic acid were mixed together in a container. The contents of the container was heated up to a temperature between about 140 to about 160° C. to dissolve the cinnamic acid in the resin. As this was cooling, 12 parts by weight of MTHPA (based on 100 parts of the carrier) was added to the mixture to form the carrier. Solder particles having 96.5 weight percent tin and 3.5 weight percent silver, and sizes less than about 20 microns were mixed with the carrier to form the conductive composition. The amount of solder particles mixed with the carrier was such that the final conductive composition included about 90 weight percent solder particles and about 10 weight percent carrier.

EXAMPLE 4

A multi-layer circuit substrate was formed with the conductive composition of Example 3. The same steps as outlined in Example 2 were followed except that the tin-silver conductive composition of Example 3 was used in place of the lead-tin composition of Example 1, and that the conductive composition in the apertures was heated to a temperature of about 235° C. Ends of the generally cylindrical tin-silver via structures bonded to respective confronting conductive pads on the two flexible circuit substrates providing electrical communication between confronting pads. The electrical resistance of the formed solder via structures was about 2.1 milli-ohm (with a standard deviation of about 0.2 milli-ohm) for the 180 micron via structures. Over 17,000 via structures were formed, and favorable peel strengths on the order of about 1.2 kg/cm were achieved. The peel strength was measured in a region proximate to, but away from the formed via structure. No blistering was observed.

EXAMPLE 5

A conductive composition according to another embodiment of invention was made. In this embodiment, the conductive composition was also lead-free. As in Example 1, a carrier was formed in this example. Based on 100 parts of the carrier, 77 parts by weight of Heloxy® 505 resin and 11 parts by weight of solid cinnamic acid were mixed together in a container. The contents of the container was heated up to a temperature between about 140 to about 160°

C. to dissolve the cinnamic acid in the resin. As this was cooling, 12 parts by weight of MTHPA (based on 100 parts of the carrier) was added to the mixture to form the carrier. Solder particles having 95 weight percent tin and 5 weight percent antimony, and sizes less than about 20 microns were mixed with the carrier to form the conductive composition. The amount of solder particles mixed with the carrier was such that the final conductive composition included about 90 weight percent solder particles and about 10 weight percent carrier.

EXAMPLE 6

A multi-layer circuit substrate was formed with the conductive composition of Example 3. The same steps as outlined in Example 2 were followed except that the tin-antimony conductive composition of Example 5 was used in place of the lead-tin composition of Example 1, and that the conductive composition in the apertures was heated to a temperature of about 255° C. Ends of the generally cylindrical tin-antimony via structures bonded to respective confronting conductive pads on the two flexible circuit substrates providing electrical communication between confronting pads. The electrical resistance of the formed solder via structures was about 1.6 milli-ohm (with a standard deviation of about 0.1 milli-ohm) for the 180 micron via structures. Over 17,000 via structures were formed, and favorable peel strengths on the order of about 1.2 kg/cm were achieved. The peel strength was measured in a region proximate to, but away from the formed via structure. No blistering was observed.

EXAMPLE 7

A conductive composition according to an embodiment of invention was made. A carrier was formed. Based on 100 parts of the carrier, 80 parts by weight of Heloxy® 505 resin and 20 parts by weight of solid cinnamic acid were mixed together in a container. The contents of the container was heated to 140° C. to dissolve the cinnamic acid in the resin. In this example, no MTHPA was added to the carrier. The heated mixture was then cooled to form the carrier. Solder particles having 80 weight percent gold and 20 weight percent tin, and sizes less than about 20–25 microns were mixed with the carrier to form the conductive composition. The amount of solder particles mixed with the carrier was such that the final composition included about 90 weight percent solder particles and about 10 weight percent carrier.

EXAMPLE 8

A multi-layer circuit substrate was formed with the conductive composition of Example 8. The same steps as outlined in Example 2 were followed except that the gold-tin composition of Example 7 was used in place of the lead-tin composition of Example 1, and that the conductive composition in the apertures was heated to a temperature between about 290–295° C. Also, the bonding sheet included a thermoplastic polyimide adhesive (DuPont Kapton® KJ adhesive). Further, in this example, the conductive pads on one flexible circuit substrate included bare copper, while the conductive pads on the other flexible circuit substrate included an electroless nickel layer and a gold flash coating layer. The ends of the gold-tin via structures bonded to respective confronting conductive pads on the two flexible circuit substrates providing electrical communication between the confronting pads. The electrical resistance of the formed via structures were observed to be about 2.7 milli-ohm (with a standard deviation of about 0.1 milli-ohm) for the 180 micron via structures. Over 17,000 joints were formed and favorable peel strengths on the order of about 1.0 kg/cm was achieved. The peel strength was measured in a region proximate to, but away from the formed via structure. No blistering was observed.

While the present invention has been particularly described with respect to the illustrated embodiment, it will be appreciated that various alterations, modifications and adaptations may be made based on the present disclosure, and are intended to be within the scope of the present invention. For example, additives not specifically discussed herein can be included in the conductive composition without departing from the scope and the spirit of the invention. While the invention has been described in connection with what is presently considered to be the most practical and preferred embodiment(s), it is to be understood that the present invention is not limited to the disclosed embodiment (s) but, on the contrary, is intended to cover various modifications and equivalent arrangements included within the scope of the appended claims.

What is claimed is:

1. An multi-layer circuit substrate comprising:
   a first circuitized structure having a conducting region;
   a second circuitized structure having a conducting region;
   a dielectric layer disposed between the first and second circuitized structures and having an aperture; and
   a via structure including a conductive composition in a cured state disposed within the aperture and electrically communicating with the conducting regions of the first and second circuitized structures, said conductive composition comprising:
   conductive particles in an amount of at least about 75 wt. % based on the weight of the composition, wherein at least 50% by weight of the conductive particles have melting points of less than about 400° C.; and
   a carrier including an epoxy-functional resin in an amount of at least about 50 wt. % based on the weight of the carrier, the epoxy functional resin having a viscosity of less than about 1000 centipoise at 25° C., and a fluxing agent in an amount of at least about 0.1 wt % based on the weight of the carrier.

2. The multi-layer circuit substrate of claim 1 further comprising a first intermetallic bonding region disposed between and in contact with the conducting region on the first circuitized structure and the via structure, and a second intermetallic bonding region disposed between and in contact with the conducting region on the second circuitized structure and the via structure.

3. The multi-layer circuit substrate of claim 1 wherein the via structure has a resistance of less than about 2 milli-ohms.

4. The multi-layer circuit substrate of claim 1 wherein the via structure comprises an annular sleeve comprising the carrier in a cured state, and a mass of fused conductive particles disposed within the sleeve.

5. An electrical assembly comprising:
   a first conducting region;
   a second conducting region;
   a dielectric layer disposed between the first and second conducting regions and having an aperture; and
   a via structure including a conductive composition in a cured state disposed within the aperture and electrically communicating with the first and second conducting regions, said conductive composition comprising:
   conductive particles in an amount of at least about 75 wt. % based on the weight of the composition, wherein at least 50% by weight of the conductive particles have melting points of less than about 400° C.; and
   a carrier including an epoxy-functional resin in an amount of at least about 50 wt. % based on the weight of the carrier, the epoxy functional resin having a viscosity of less than about 1000 centipoise at 25° C., and a fluxing agent in an amount of at least about 0.1 wt % based on the weight of the carrier.

6. The electrical assembly of claim 5 further comprising one or more chips disposed in electrical communication with the via structure.

7. The electrical assembly of claim 5 wherein the first conducting region comprises an annular conductive structure.

8. A multi-layer circuit substrate comprising:

a first circuitized structure having a conducting region;

a second circuitized structure having a conducting region;

a dielectric layer disposed between the first and second circuitized layers and having an aperture; and a via structure including a conductive composition in a cured state disposed within the aperture and electrically communicating with the conducting regions of the first and second circuitized structures, said conductive composition being made by the process comprising:

mixing conductive particles and a carrier together to form a mixture, wherein the conductive particles are in an amount of at least about 75 wt. % based on the weight of the composition, wherein at least 50% by weight of the conductive particles have melting points less than about 400° C.; and wherein the carrier includes an epoxy-functional resin in an amount of at least about 50 wt. % based on the weight of the carrier, the epoxy functional resin having a viscosity of less than about 1000 centipoise at 25° C., and a fluxing agent in an amount of at least about 0.1 wt % based on the weight of the carrier.

9. The multi-layer circuit substrate of claim 8 further comprising a first intermetallic bonding region disposed between and in contact with the conducting region on the first circuitized structure and the via structure, and a second intermetallic bonding region disposed between and in contact with the conducting region on the second circuitized structure and the via structure.

10. The multi-layer circuit substrate of claim 8 wherein the via structure has a resistance of less than about 2 milli-ohms.

11. The multi-layer circuit substrate of claim 8 wherein the via structure comprises an annular sleeve comprising the carrier in a cured state, and a mass of fused conductive particles disposed within the sleeve.

12. An electrical assembly comprising:

a first conducting region;

a second conducting region;

a dielectric layer disposed between the first and second conducting regions and having an aperture; and a via structure including a conductive composition in a cured state disposed within the aperture and electrically communicating with the first and second conducting regions, said conductive composition being made by the process comprising:

mixing conductive particles and a carrier together to form a mixture, wherein the conductive particles are in an amount of at least about 75 wt. % based on the weight of the composition, wherein at least 50% by weight of the conductive particles have melting points less than about 400° C.; and wherein the carrier includes an epoxy-functional resin in an amount of at least about 50 wt. % based on the weight of the carrier, the epoxy functional resin having a viscosity of less than about 1000 centipoise at 25° C., and a fluxing agent in an amount of at least about 0.1 wt % based on the weight of the carrier.

13. The electrical assembly of claim 12, further comprising one or more chips disposed in electrical communication with the via structure.

14. The electrical assembly of claim 12, wherein the first conducting region comprises a conductive annular structure.

15. The multi-layer circuit substrate of claim 1 wherein the fluxing agent comprises cinnamic acid.

16. The multi-layer circuit substrate of claim 1 wherein said carrier further comprises a curing agent, and the curing agent comprises methyltetrahydrophthalic anhydride.

17. The multi-layer circuit substrate of claim 1 wherein the epoxy-functional resin is derived from castor oil.

18. The multi-layer circuit substrate of claim 1 wherein the epoxy-functional resin comprises a weight per epoxide greater than about 500.

19. The multi-layer circuit substrate of clam 1 wherein the conductive particles comprise solder particles.

20. The multi-layer circuit substrate of claim 1 wherein the fluxing agent comprises an organic acid capable of curing the resin and the carrier does not include an additional curing agent.

21. The electrical assembly of claim 5 wherein the fluxing agent comprises cinnamic acid.

22. The electrical assembly of claim 5 wherein said carrier further comprises a curing agent, and the curing agent comprises methyltetrahydrophthalic anhydride.

23. The electrical assembly of clan 5 wherein the epoxy-functional resin is derived from castor oil.

24. The electrical assembly of claim 5 wherein the epoxy-functional resin comprises a weight per epoxide greater than about 500.

25. The electrical assembly of claim 5 wherein the conductive particles comprise solder particles.

26. The electrical assembly of claim 5 wherein the fluxing agent comprises an organic acid capable of curing the resin and the carrier does not include an additional curing agent.

27. The multi-layer circuit substrate of claim 8 wherein the fluxing agent comprises cinnamic acid.

28. The multi-layer circuit substrate of claim 8 wherein said carrier further comprises a curing agent, and the curing agent comprises methyltetrahydrophthalic anhydride.

29. The multi-layer circuit substrate of claim 8 wherein the epoxy-functional resin is derived from castor oil.

30. The multi-layer circuit substrate of claim 8 wherein the epoxy-functional resin comprises a weight per epoxide greater than about 500.

31. The multi-layer circuit substrate of claim 8 wherein the conductive particles comprise solder particles.

32. The multi-layer circuit substrate of claim 8 wherein the fluxing agent comprises an organic acid capable of curing the resin and the carrier does not include an additional curing agent.

33. The electrical assembly of claim 12 wherein the fluxing agent comprises cinnamic acid.

34. The electrical assembly of claim 12 wherein said carrier further comprises a curing agent, and the curing agent comprises methyltetrahydrophthalic anhydride.

35. The electrical assembly of claim 12 wherein the epoxy-functional resin is derived from castor oil.

36. The electrical assembly of claim 12 wherein the epoxy-functional resin comprises a weight per epoxide greater than about 500.

37. The electrical assembly of claim 12 wherein the conductive particles comprise solder particles.

38. The electrical assembly of claim 12 wherein the fluxing agent comprises an organic acid capable of curing the resin and the carrier does not include an additional curing agent.

* * * * *